(12) United States Patent
Okumura et al.

(10) Patent No.: US 10,462,914 B2
(45) Date of Patent: Oct. 29, 2019

(54) COVER STRUCTURE AND ELECTRIC CONNECTION BOX

(71) Applicant: SUMITOMO WIRING SYSTEMS, LTD., Yokkaichi, Mie (JP)

(72) Inventors: Masakazu Okumura, Yokkaichi (JP); Akihiro Oda, Yokkaichi (JP); Tatsuya Daidoji, Yokkaichi (JP); Ryoma Hamada, Yokkaichi (JP); Noriko Okamoto, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 16/146,041

(22) Filed: Sep. 28, 2018

(65) Prior Publication Data

US 2019/0124779 A1    Apr. 25, 2019

(30) Foreign Application Priority Data

Oct. 19, 2017 (JP) .................. 2017-202568

(51) Int. Cl.
*H05K 5/00* (2006.01)
*H01R 13/52* (2006.01)
*H01R 12/72* (2011.01)

(52) U.S. Cl.
CPC ....... *H05K 5/0056* (2013.01); *H01R 13/5202* (2013.01); *H05K 5/0069* (2013.01); *H01R 12/724* (2013.01); *H01R 13/5227* (2013.01)

(58) Field of Classification Search
CPC .. H05K 5/0056; H05K 5/0069; H05K 5/0026; H01R 12/724; H01R 13/5202; H01R 13/5227; H01R 13/523
USPC .............................. 439/76.1, 76.2, 190, 205
See application file for complete search history.

(56) References Cited

U.S. PATENT DOCUMENTS

| | | | | |
|---|---|---|---|---|
| 6,796,809 B2* | 9/2004 | Kakuta | ............... | H01R 13/5227 439/206 |
| 6,982,379 B2* | 1/2006 | Saka | ................... | H01R 13/5227 174/135 |
| 7,883,342 B2* | 2/2011 | Yoshida | ............. | H01R 13/5227 439/205 |
| 7,950,931 B2* | 5/2011 | Nakanishi | .............. | H02G 3/088 439/76.2 |
| 9,356,385 B2* | 5/2016 | Kobayashi | ......... | H01R 13/5202 |

FOREIGN PATENT DOCUMENTS

JP    2014-236654 A    12/2014

* cited by examiner

*Primary Examiner* — Travis S Chambers
(74) *Attorney, Agent, or Firm* — Oliff PLC

(57) ABSTRACT

A cover structure that includes a base that is attached to a circuit substrate of an electric connection box on which an electrical component is mounted, the base being used as a receptacle for a cable that is to be electrically connected to the electrical component; and a housing that houses the circuit substrate.

7 Claims, 6 Drawing Sheets

COVER STRUCTURE AND ELECTRIC CONNECTION BOX

This application claims priority from JP 2017-202568 filed Oct. 19, 2017, the entire disclosure of which is incorporated herein by reference.

BACKGROUND

The present disclosure relates to an electric connection box mounted on a vehicle.

An electric connection box that is mounted on a vehicle includes a connection portion that is connected to a cable that is connected to a battery and electronic devices, a relay that is connected to the connection portion, an electrical component such as a fuse, and a housing member that houses these components. Various proposals have been made for the waterproof structure of the electric connection box in consideration of when the vehicle is traveling in rain, when the vehicle is being washed, or the like.

JP 2014-236654A discloses a waterproof structure for an electric connection box constructed by attaching a box-shaped base on which an electrical component is attached, and a cover that covers the electrical component to each other. In particular, JP 2014-236654A discloses that the side plate of the base portion and the peripheral plate that is provided standing upright around the peripheral edge of the cover are both configured to have a double structure, and the inner peripheral plate is configured to extend to a position lower than the outer peripheral plate so as to prevent water from entering from the joint portion between the base and the cover.

SUMMARY

There is demand not only for preventing water from entering from the joint portion of the housing member as disclosed in JP 2014-236654A, but also for preventing water that runs along the surface of a connected cable from entering. Also, in the case where the electric connection box is mounted on an automobile, the electric connection box is also required to have vibration resistance so as to withstand vibrations that occur while the automobile is traveling. That is, there is a need to more safely prevent water from entering from the connection portion, and at the same time, improve vibration resistance.

An exemplary aspect of the disclosure provides a cover structure for an electric connection box (that can easily be made waterproof and vibration resistant/that can easily realize waterproofness and vibration resistance), and an electric connection box that includes the cover structure.

A cover structure according to one aspect of the present disclosure is a cover structure including: a base that is attached to a circuit substrate of an electric connection box on which an electrical component is mounted, the base being used as a receptacle for a cable that is to be electrically connected to the electrical component; and a housing that houses the circuit substrate, wherein the base is molded from an insulating material into a unitary body that has a shape including: a bottomed tube that has an opening into which a plug of the cable is fitted; a drainage hole that is formed in a portion of a side plate of the bottomed tube so as to extend through a bottom plate; and a wall that stands so as to surround a perimeter of the drainage hole on an outer surface of the bottom plate, a locking rod that covers the bottom plate side of the drainage hole is provided standing upright on an inner side of the housing, and the locking rod abuts against an inner side of the wall on the outer surface of the bottom plate.

An electric connection box according to one aspect of the present disclosure is an electric connection box including: a circuit substrate on which an electrical component is mounted and to which a receptacle for a cable that is electrically connected to the electrical component is to be attached; and a housing that houses the circuit substrate, wherein a base of the receptacle is molded from an insulating material into a unitary body that has a shape including: a bottomed tube that has an opening into which a plug of the cable is fitted; a drainage hole that is formed in a portion of a side plate of the bottomed tube so as to extend through a bottom plate; and a wall that stands so as to surround a perimeter of the drainage hole on an outer surface of the bottom plate, the wall is attached to the circuit substrate so as to extend in a direction opposite to the circuit substrate, and a locking rod that abuts against an inner side of the wall and covers the bottom plate side of the drainage hole is provided standing upright on an inner side of the housing.

According to the present application, it is possible to not only implement a characteristic cover structure and an electric connection box that includes the cover structure as described above, but also use at least one of the constituent elements of the cover structure as a component, or use the cover structure used in the electric connection box of the present disclosure as a cover for another apparatus.

According to the foregoing, the electric connection box can be easily made waterproof and vibration resistant.

DETAILED DESCRIPTION OF EMBODIMENTS

Description of Embodiment

Figure 1:
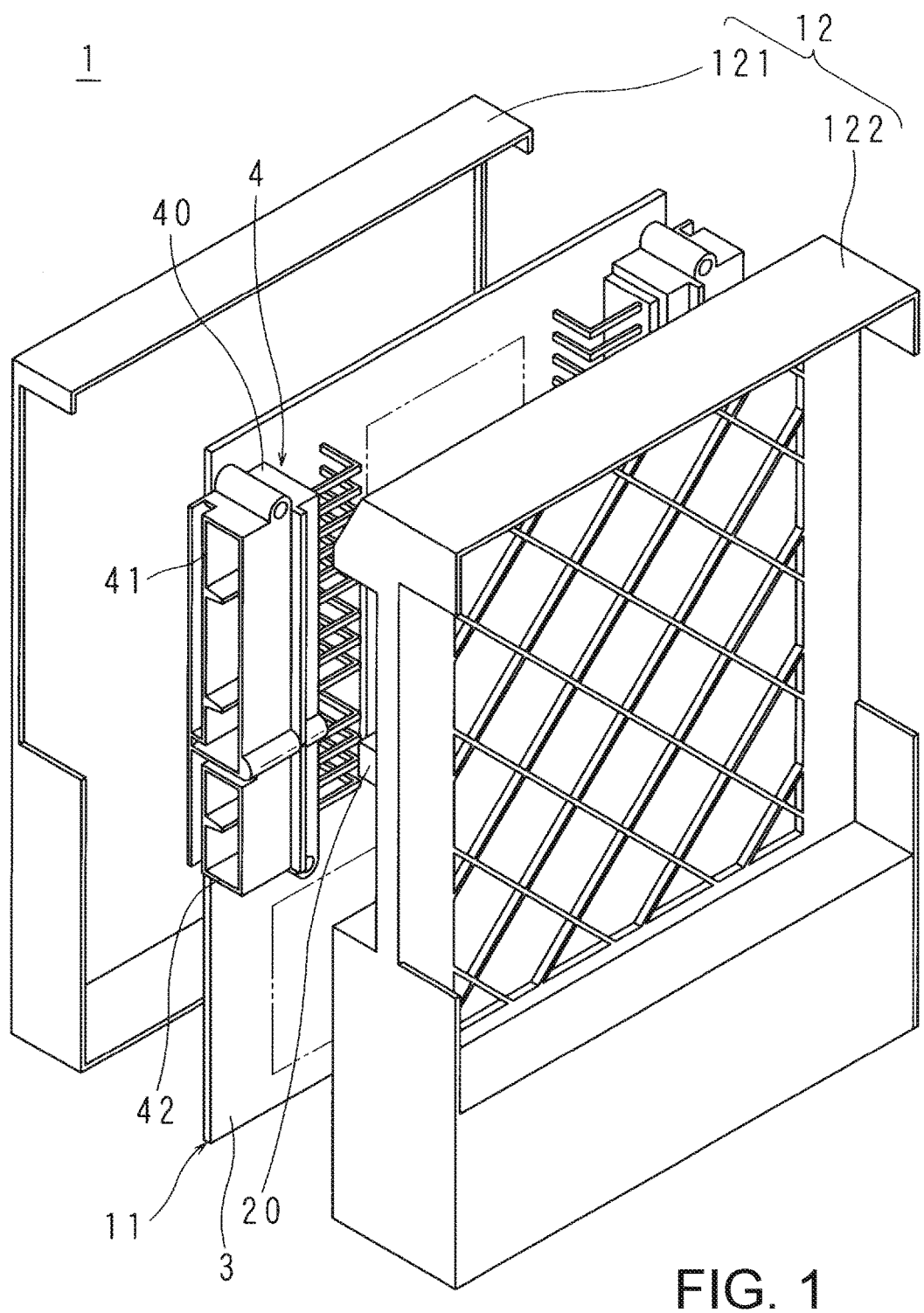
FIG. 1 is a schematic exploded perspective view of an electric connection box according to one embodiment of the present disclosure.

First, aspects according to the present disclosure are listed and described. Also, at least a portion of the embodiments described below may be combined in any way.

(1) A cover structure according to one aspect of the present disclosure is a cover structure including: a base member (i.e., base) that is attached to a circuit substrate of an electric connection box on which an electrical component is mounted, the base member being used as a receptacle for a cable that is to be electrically connected to the electrical component; and a housing member (i.e., housing) that houses the circuit substrate, wherein the base member is molded from an insulating material into a unitary body that has a shape including: a bottomed tube member portion (i.e., bottomed tube) that has an opening into which a plug of the cable is fitted; a drainage hole that is formed in a portion of a side plate of the bottomed tube member portion so as to extend through a bottom plate; and a wall that stands so as to surround a perimeter of the drainage hole on an outer surface of the bottom plate, a locking rod that covers the bottom plate side of the drainage hole is provided standing upright on an inner side of the housing member, and the locking rod abuts against an inner side of the wall on the outer surface of the bottom plate.

According to this aspect of the present disclosure, the base member of the receptacle that is attached to a peripheral edge portion of the circuit substrate with the opening facing outward is molded from a resin into a unitary body for waterproofing. Because the base member of the receptacle is molded into a unitary body, when forming a drainage hole in the bottomed tube member portion that corresponds to the opening, the hole extends through the bottom plate, but a wall that stands so as to surround the bottom plate side-opening of the drainage hole is provided on the outer surface of the bottom plate of the receptacle, and a locking rod that abuts against the wall and closes the bottom plate side-opening of the drainage hole, along the bottom plate, is provided standing upright on the housing member.

With this configuration, the locking rod that abuts against the wall prevents water from entering from the drainage hole, and suppresses rattling between the circuit substrate and the housing member via the receptacle. Accordingly, waterproofness and vibration resistance are improved.

(2) An electric connection box according to one aspect of the present disclosure is an electric connection box including: a circuit substrate on which an electrical component is mounted and to which a receptacle for a cable that is electrically connected to the electrical component is to be attached; and a housing member that houses the circuit substrate, wherein a base member of the receptacle is molded from an insulating material into a unitary body that has a shape including: a bottomed tube member portion that has an opening into which a plug of the cable is fitted; a drainage hole that is formed in a portion of a side plate of the bottomed tube member portion so as to extend through a bottom plate; and a wall that stands so as to surround a perimeter of the drainage hole on an outer surface of the bottom plate, the wall is attached to the circuit substrate so as to extend in a direction opposite to the circuit substrate, and a locking rod that abuts against an inner side of the wall and covers the bottom plate side of the drainage hole is provided standing upright on an inner side of the housing member.

According to this aspect of the present disclosure, as described in (1), the locking rod prevents water from entering from the drainage hole, and suppresses rattling between the circuit substrate and the housing member via the receptacle. Thus, waterproofness and vibration resistance are improved.

(3) An electric connection box according to one aspect of the present disclosure is configured such that the base member of the receptacle is attached to a peripheral edge portion of the circuit substrate, with the opening facing outside, such that the bottom plate is substantially perpendicular to the circuit substrate, and the wall surrounds a perimeter of a bottom plate side-opening of the drainage hole, on the outer surface of the bottom plate, except for a portion that is located distally from the circuit substrate.

According to this aspect of the present disclosure, the recess that is formed on the outer surface of the bottom plate at a position that is located distally from the circuit substrate serves as a wall that surrounds the bottom plate side-opening of the drainage hole, and also serves as a wall against which the locking rod provided standing upright on the housing member abuts. The locking rod closes the opening, and at the same time, suppresses rattling between the circuit substrate and the housing member.

(4) An electric connection box according to one aspect of the present disclosure is configured such that the bottomed tube member portion is composed of a plurality of flat rectangular tube members (i.e., rectangular tubes) that are arranged side by side with a predetermined gap therebetween, the receptacle is attached such that a side-by-side arrangement direction in which the rectangular tube members are arranged side by side extends along a lateral side of the circuit substrate, and the drainage hole is formed in a portion of a side plate that opposes the gap, the side plate being included in one of the rectangular tube members that are arranged side by side, so as to extend through the bottom plate.

According to this aspect of the present disclosure, a plurality of tube members that correspond to a plurality of openings for cables are provided, and a gap is formed between the plurality of tube members that correspond to the plurality of openings. Also, in a portion of a side plate that opposes the gap, the side plate being included in one of the tube members that are provided side by side, a drainage hole for the tube member is formed so as to extend through the bottom plate. That is, the interior of the rectangular tube member is in communication with the gap portion formed between the rectangular tube member and an adjacent rectangular tube member. Water that has entered from the opening of the rectangular tube member is discharged from the hole formed in the side plate and escapes into the gap, and therefore the water is prevented from entering into the other rectangular tube member.

(5) An electric connection box according to one aspect of the present disclosure is configured such that the locking rod includes: a cap plate that covers a bottom plate side-opening of the drainage hole along the bottom plate; and a rib plate that is provided at a substantially right angle on a side of the cap plate that is opposite to the drainage hole side, the rib plate being configured to abut against the inner side of the wall.

According to this aspect of the present disclosure, the cap plate of the locking rod, which covers the drainage hole, is provided with a rib. Accordingly, it is possible to prevent the locking rod from being bent when a force is applied to the cap plate.

(6) An electric connection box according to one aspect of the present disclosure is configured such that the housing member includes a cover plate that covers the electrical component so as to oppose the circuit substrate, and the locking rod is provided standing upright at substantially the center of each lateral side portion of the cover plate so as to form a U-shaped cross section facing inward.

According to this aspect of the present disclosure, the locking rod is formed on each lateral side portion of the cover plate so as to have a U-shaped cross section facing inward. A vertical bar of the U shape corresponds to the cap plate, and horizontal line bars correspond to ribs. As a result of the cross section being formed in a U shape, it is possible to prevent the locking rod from being bent.

(7) An electric connection box according to one aspect of the present disclosure is an electric connection box including: a rectangular circuit substrate on which an electrical component is mounted and to which a receptacle for a cable that is electrically connected to the electrical component is attached; and a housing member that houses the circuit substrate between a housing box and a cover plate, wherein a base member of the receptacle is molded from an insulating material into a unitary body that includes: a plurality of flat rectangular tube members that are arranged side by side in a longitudinal direction with a predetermined gap therebetween on a rectangular bottom plate; a drainage hole that is formed in a portion of a side plate that opposes the gap, the side plate being included in one of the rectangular tube members that are arranged side by side, so as to extend through the bottom plate; and a thick bottom portion that is formed on an outer surface of the bottom plate, and includes, on one long side of the bottom plate, a recess that surrounds a perimeter of a bottom plate side-opening of the drainage hole in a U shape, the receptacle is attached to a lateral side portion of the circuit substrate such that the bottom plate is substantially perpendicular to the circuit substrate, openings of the rectangular tube members face outward so that a side-by-side arrangement direction in which the rectangular tube members are arranged side by side extends along the circuit substrate, and the recess is located distally from the circuit substrate, and a locking rod that abuts against a surface of the U shape of the recess and covers the bottom plate side of the drainage hole is provided standing upright on an inner side of the housing box or the cover plate of the housing member.

According to this aspect of the present disclosure, the base member of the receptacle that is attached to a peripheral edge portion of the circuit substrate with the opening facing outward is formed by disposing a plurality of tube members that correspond to openings for cables side by side with a gap therebetween, on the rectangular bottom plate. In one of the rectangular tube members that are disposed side by side, a drainage hole is formed in a portion of a side plate that opposes the gap. When a plurality of openings for cables are provided, water that has run along one cable and entered from the opening is discharged from the hole formed in the side plate and escapes to the gap portion formed between the plurality of tube members, and thus the water is prevented from entering the other tube member. Also, because the receptacle is molded into a unitary body, when forming a drainage hole in the receptacle, the hole inevitably extends through the bottom plate, but a wall that stands so as to surround the bottom plate side-opening of the drainage hole is provided in the bottom plate of the receptacle, and a locking rod that abuts against the wall and closes the bottom plate side-opening of the drainage hole along the bottom plate is provided standing upright on the housing member. With this configuration, the locking rod that abuts against the wall prevents water from entering from the drainage hole, and suppresses rattling between the circuit substrate and the housing member via the receptacle. Thus, waterproofness and vibration resistance are improved.

DETAILED DESCRIPTION OF EMBODIMENTS

A specific example of a housing structure for housing an electric connection box according to an embodiment of the present disclosure will be described below with reference to the drawings. It is to be noted that the present disclosure is not limited to the examples given below.

FIG. 1 is a schematic exploded perspective view of an electric connection box 1 according to one embodiment of the present disclosure. The electric connection box 1 is formed by housing a circuit substrate 11, on which a relay and an electrical component are mounted, in a housing member 12. The housing member 12 includes a lower case 121 and an upper case 122. The lower case 121 and the upper case 122 are both unitary molded bodies that are made of resin. The lower case 121 has a rectangular box shape, with cut-outs made over a predetermined length in the side plates that are on the long sides of the rectangular box shape. FIG. 1 shows only a cut-out portion on one side, but a cut-out portion is also formed at the same position on the opposite side by making a cut-out over the same length. The upper case 122 includes a cover plate sized to correspond to a bottom plate of the lower case 121, and end walls that extend along each short side of the cover plate and project to both sides in the thickness direction. The circuit substrate 11 is interposed and housed between the lower case 121 and the upper case 122.

Figure 2:
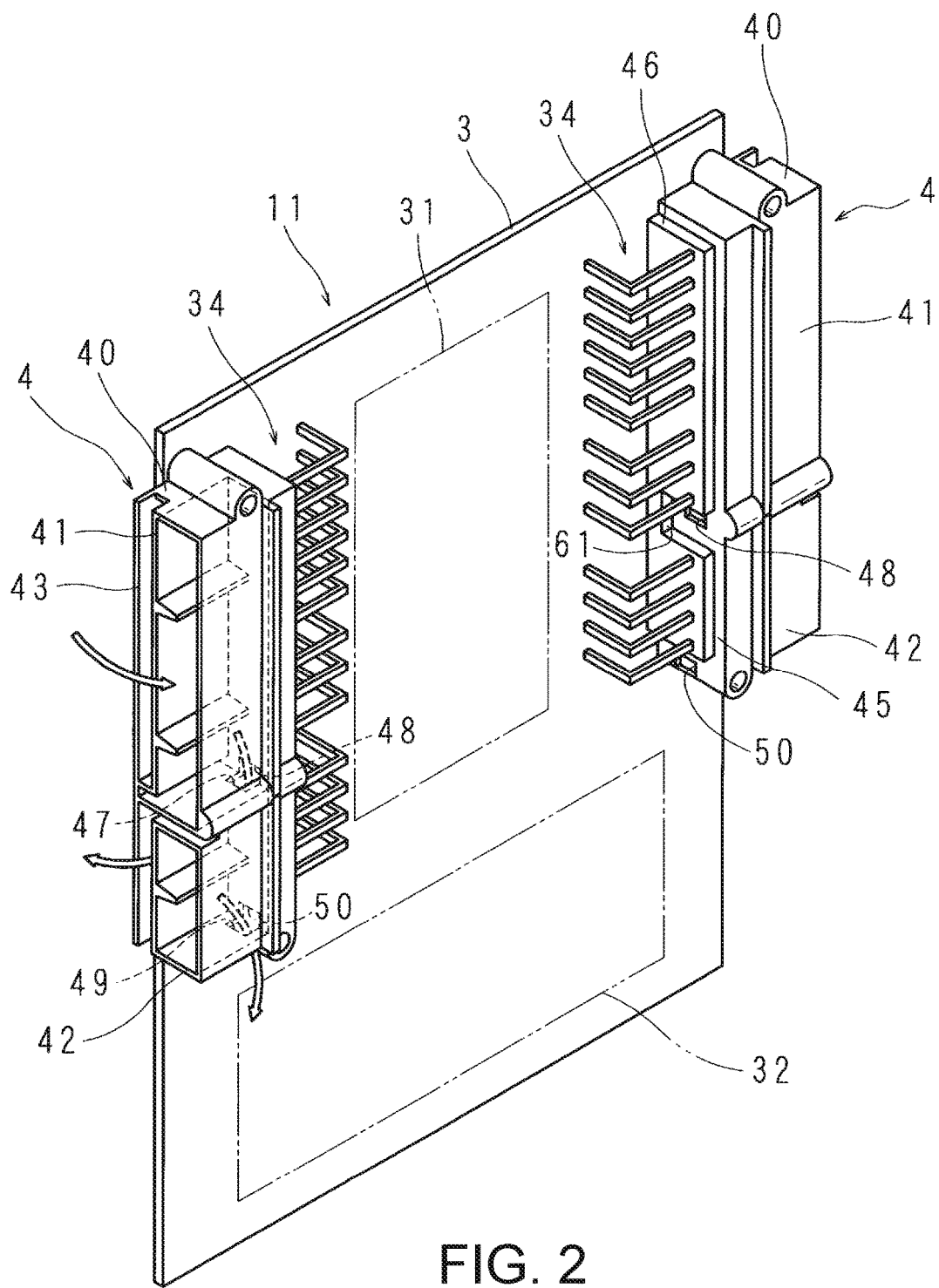
FIG. 2 is a perspective view of a circuit substrate.
Figure 3:
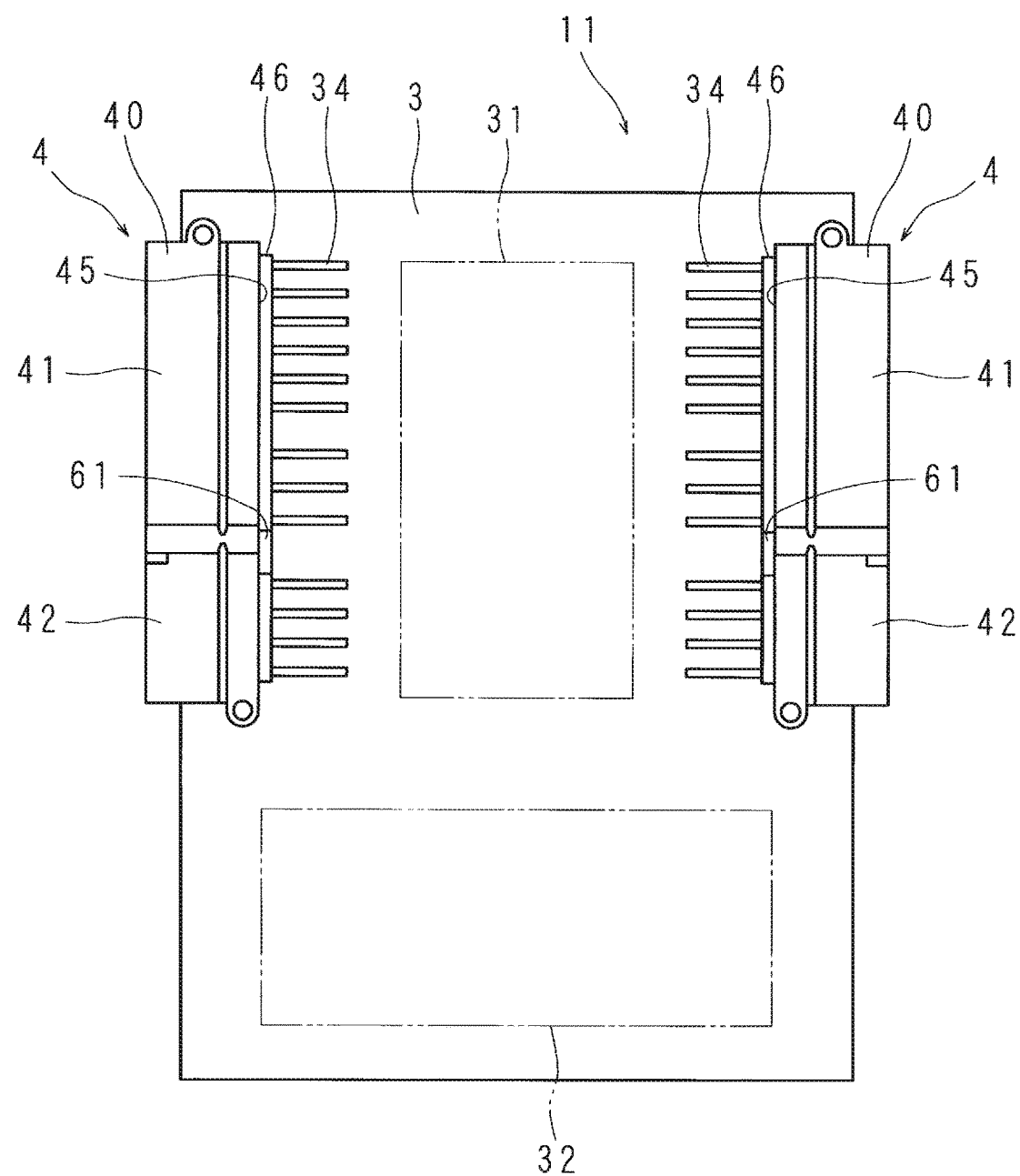
FIG. 3 is a plan view of the circuit substrate.

FIG. 2 is a perspective view of the circuit substrate 11, and FIG. 3 is a plan view of the circuit substrate 11. In the circuit substrate 11, a mounting region 32 in which power supply-related electrical components such as a relay are mounted is set on the narrow side when a substantially rectangular substrate 3 is divided in the longitudinal direction to a ratio of substantially 2:1. On the wide side, a mounting region 31 in which power supply control-related electrical components are mounted is set at the center. On two sides of the mounting region 31, a receptacle 4 (connection portion) for cable connection is attached running along a lateral side portion of the substrate 3.

The receptacle 4 is formed by providing a base member 40 that is a unitary molded body made of resin with connection pins 34, which will be described later. The base member 40 of the receptacle 4 includes, on a rectangular bottom plate 45, a first tube member portion 41 and a second tube member portion 42 that are arranged side by side in the longitudinal direction. The first tube member portion 41 and the second tube member portion 42 are flat rectangular tube members, and the first tube member portion 41 is longer in the longitudinal direction than the second tube member portion 42. The first tube member portion 41 and the second tube member portion 42 are arranged side by side in the longitudinal direction with a gap therebetween. The base member 40 includes an attachment plate 43 that extends along the direction in which the first tube member portion 41 and the second tube member portion 42 are arranged side by side, with a gap between the attachment plate 43 and the first and second tube member portions 41 and 42.

In the first tube member portion 41 of the base member 40, a drainage hole 47 is formed. The drainage hole 47 is a rectangular hole that is formed in one of two side plates of the first tube member portion 41 that opposes the gap between the first tube member portion 41 and the second tube member portion 42, at a position toward the bottom plate 45 so as to extend through the bottom plate 45. The drainage hole 47 is formed by a projection of a die provided on the bottom plate 45 side when the receptacle 4 is molded into a unitary body. An opening 48 that is continuous with the bottom plate 45 is formed for releasing the receptacle 4 from the die. In the second tube member portion 42 as well, a drainage hole 49 that has a rectangular shape is formed in one of two side plates of the second tube member portion 42 that is provided opposite to the side plate that opposes the first tube member portion 41, at a position toward the bottom plate 45 so as to extend through the bottom plate 45. Likewise, an opening 50 that is continuous with the bottom plate 45 is formed for releasing the receptacle 4 from the die.

Also, a thick bottom portion 46 is formed on the bottom plate 45 of the base member 40 of the receptacle 4 so as to extend substantially over an outer surface of the bottom plate 45, and a recess 61 is formed in the long side of the thick bottom portion 46 that is located distally from the attachment plate 43. The interior of the recess 61 is a wall that stands upright so as to surround three sides of the opening 48.

The base member 40 of the receptacle 4 configured as described above is fixed such that the attachment plate 43 abuts against the surface of the substrate 3, and the opening side of the first tube member portion 41 and the second tube member portion 42 faces outward of the substrate 3. Two receptacles 4 are provided on the circuit substrate 11, and the receptacles 4 are mirror symmetric in shape, and are provided on the substrate 3 in the same manner.

The receptacles 4 each further include a plurality of connection pins 34 that are provided to extend through the thick bottom portion 46 on the bottom plate 45 of the base member 40. One end of each connection pin 34 is bent toward the substrate 3, and electrically connected to a circuit pattern provided on the substrate 3. The other end of each connection pin 34 protrudes from the bottom surface of the bottom plate 45 toward the interior of the first tube member portion 41 or the second tube member portion 42 (not shown in the diagrams). With this configuration, in the two receptacles 4 of the circuit substrate 11, when cable plugs are fitted into the opening of the first tube member portion 41 and the opening of the second tube member portion 42, the wire groups in the cables and the electrical components of the circuit substrate 11 are electrically connected via the connection pins 34.

Figure 4:
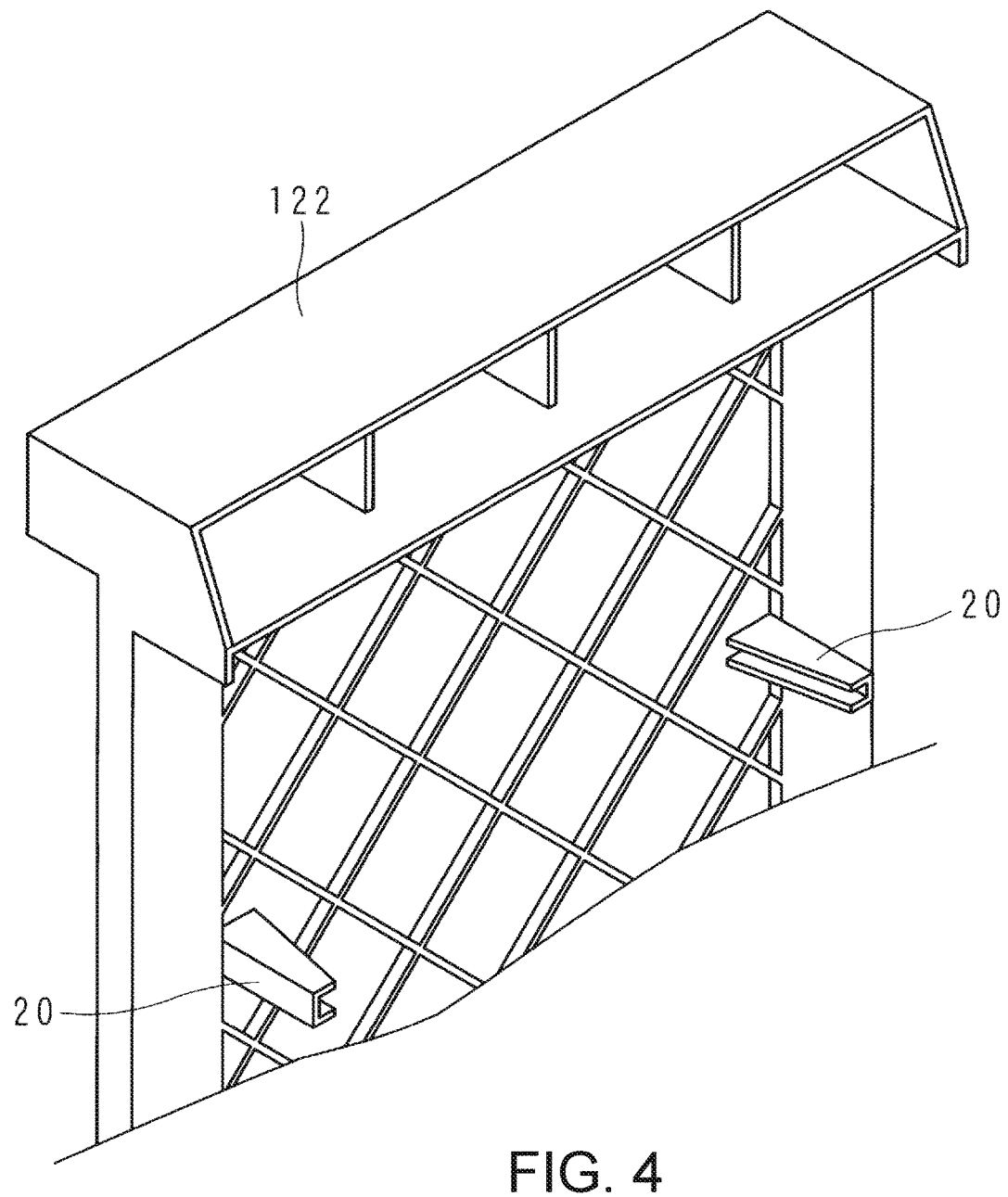
FIG. 4 is a schematic perspective view of an upper case.

FIG. 4 is a schematic perspective view of the upper case 122. FIG. 4 shows the side that is opposite to the side shown in FIG. 1. As shown in FIG. 4, two locking rods 20 are provided standing upright on one side of the cover plate of the upper case 122. Each locking rod 20 includes a strip-shaped cap plate and rib plates that extend perpendicularly from the two opposing long sides of the cap plate, and has a U-shaped cross section. The two locking rods 20 are provided standing upright at substantially the center of two lateral side portions of the cover plate such that the openings of their U-shapes oppose each other. The cap plate extends outward along a lateral side and substantially perpendicular to the cover plate. The rib plates shown in FIG. 4 each have a trapezoid shape that tapers from the bottom to the leading end, but may have a rectangular shape. The number of rib plates may be one, or three or more.

Using the components described above, an electric connection box 1 is constructed in the manner described below. First, the circuit substrate 11 is placed on the bottom plate of the lower case 121, with the receptacles 4 being positioned to correspond to the cut-out portions of the side plates of the lower case 121, and the mounting regions 31 and 32 facing upward. The upper case 122 is placed thereon such that its surface on which the locking rods 20 are provided standing upright opposes the circuit substrate 11. The positions and dimensions of the locking rods 20 are configured to correspond to the recesses 61 of the receptacles 4 that are attached to the circuit substrate 11, and the locking rods 20 are respectively engaged with the recesses 61. Then, the side plates of the lower case 121 and the upper case 122 are fitted to each other, and a plurality of screws are screwed to fix the lower case 121 and the upper case 122 to each other with the circuit substrate 11 interposed therebetween. The joint portion between the lower case 121 and the upper case 122 is designed to appropriately ensure waterproofness, and also a water discharge mechanism is provided that is used if water enters from the joint portion.

Figure 5:
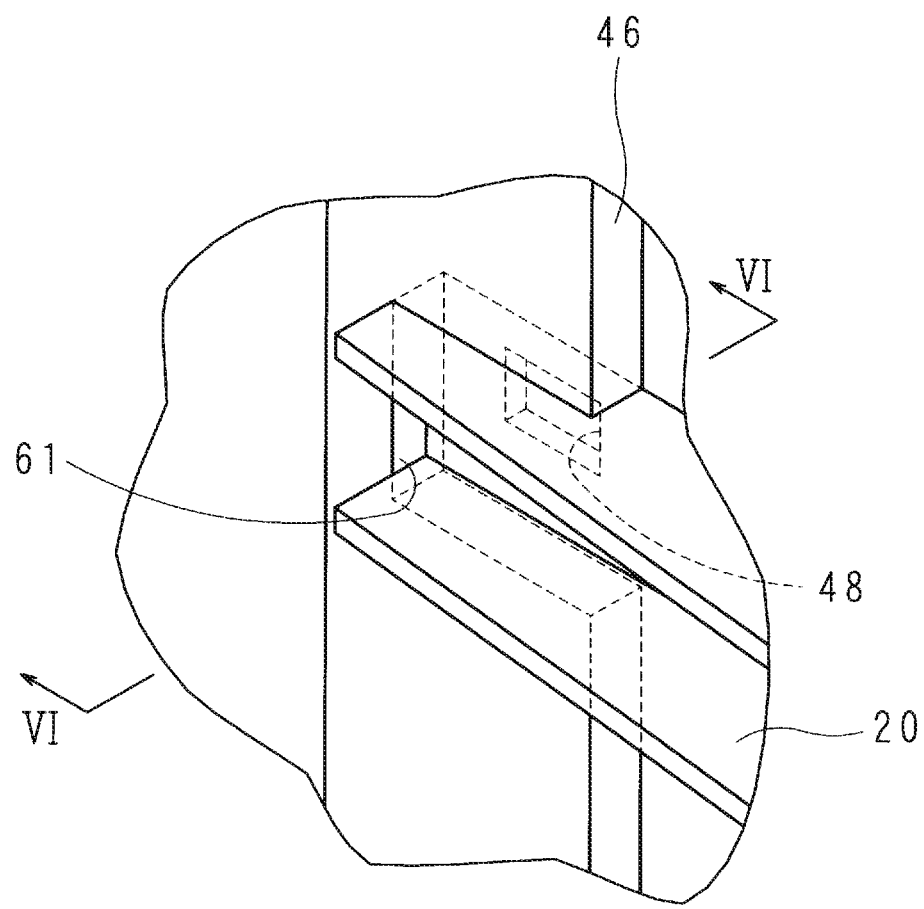
FIG. 5 is a schematic perspective view showing a state in which a locking rod is engaged with a recess.
Figure 6:
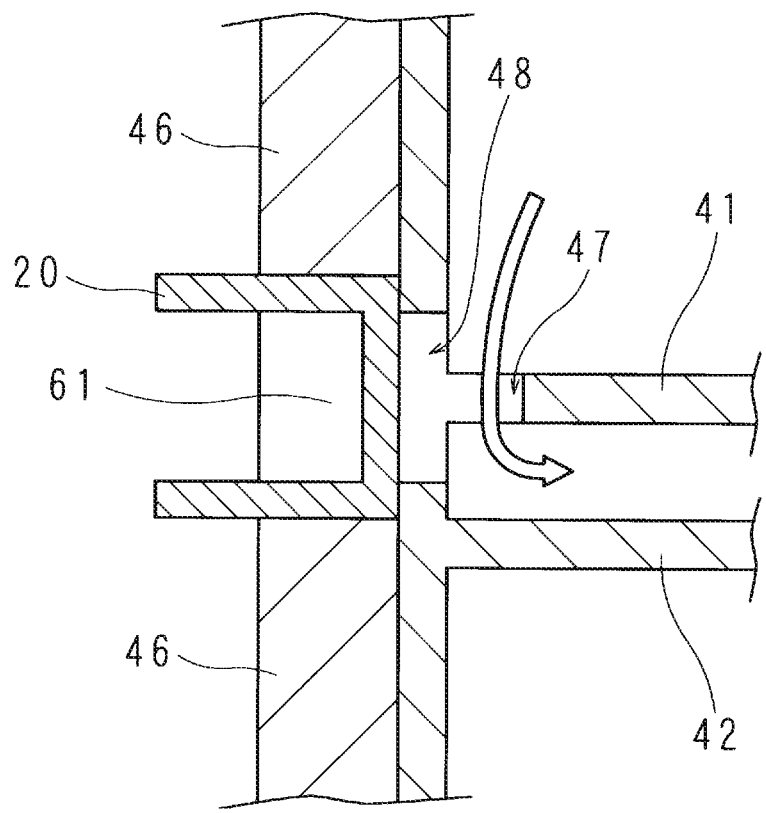
FIG. 6 is a cross sectional view taken along the line VI-VI shown in FIG. 5.

The engagement between the locking rod 20 and the thick bottom portion 46 on the bottom plate 45 of the receptacle 4 in the electric connection box 1 in this state will be described in detail. FIG. 5 is a schematic perspective view showing a state in which a locking rod 20 is engaged with a recess 61. FIG. 6 is a cross sectional view taken along the line VI-VI shown in FIG. 5. As shown in FIGS. 5 and 6, in the state in which the locking rod 20 is engaged with the recess 61, the outer surface of the cap plate entirely covers the opening 48 of the drainage hole 47 of the bottom plate 45. Also, the outer surfaces of the rib plate portions of the locking rod 20 respectively abut against the opposing surfaces of the recess 61, and the leading end of the locking rod 20 abuts against the deepest surface of the recess 61.

The electric connection box 1 is installed in an engine room of a vehicle or the like, with the mounting region 31 of the circuit substrate 11 being positioned on the upper side, and the mounting region 32 being positioned on the lower side, or in other words, with the first tube member portions 41 of the receptacles 4 being positioned on the upper side, and the second tube member portions 42 being positioned on the lower side. The electric connection box 1 may be exposed to water, for example, when the vehicle is travelling in rain, or when the vehicle is being washed. In the electric connection box 1, the joint portion between the lower case 121 and the upper case 122 of the housing member 12 is designed to appropriately ensure waterproofing and water discharge. However, water that runs along the cable may enter the receptacle 4. In this case, as indicated by white arrows in FIGS. 2 and 6, water that has entered the opening of the first tube member portion 41 is allowed to escape from the drainage hole 47 that is located in the lower portion of the first tube member portion 41 to the gap between the first tube member portion 41 and the second tube member portion 42. In this way, the drainage hole 47 functions as a water discharge outlet. In addition thereto, as shown in FIGS. 5 and 6, the opening 48, which is formed on the bottom plate 45 side, of the drainage hole 47 is entirely covered by the cap plate of the locking rod 20, and it is therefore possible to prevent water from entering the mounting region 31 of the circuit substrate 11. Water that has entered the opening of the second tube member portion 42 is discharged from the drainage hole 49 that is located in the lower portion of the second tube member portion 42, as indicated by the white arrows in FIGS. 2 and 6, and it is therefore possible to prevent water from entering at least the mounting region 31 of the circuit substrate 11 in which control system electrical components are mounted. Also, the water discharged from the drainage hole 49 is allowed to further escape to the outside by the water discharge structure of the housing member 12. Also, the mounting region 32 in which power supply-related electrical components are mounted is preferably designed so as to sufficiently withstand water if water is appropriately discharged from an even lower portion. As described above, the electric connection box 1 according to the present disclosure has improved waterproofness against water entering from the opening of the receptacle 4.

As described above, each locking rod 20 is engaged with a recess 61 such that the outer surfaces of the rib plate portions of the locking rod 20 respectively abut against the opposing surfaces of the recess 61, and the leading end of the locking rod 20 abuts against the deepest surface of the recess 61. Accordingly, rattling of the circuit substrate 11 relative to the upper case 122 is suppressed in both the longitudinal direction and the thickness direction of the circuit substrate 11. When the housing member 12 that is configured to have sufficient vibration resistance is installed in a vehicle, even if the circuit substrate 11 housed in the housing member 12 is exposed to vibrations caused by the vehicle traveling, the circuit substrate 11 is not rattled by the vibrations. Accordingly, the electronic components mounted on the circuit substrate 11 can withstand the vibrations.

As described above, with a simple configuration in which the opening 48 that is formed on the bottom plate 45 side so as to form the drainage hole 47 in the receptacle 4 that is molded from a resin into a unitary body is closed by the locking surface of the locking rod 20 that is fitted into the recess 61 formed in the receptacle 4, it is possible to improve both the waterproofness and vibration resistance of the electric connection box 1.

The embodiment disclosed herein is merely illustrative in all aspects, and thus should not be construed as limiting the scope of the present disclosure.

What is claimed is:

1. A cover structure comprising:
   a base that is attached to a circuit substrate of an electric connection box on which an electrical component is mounted, the base being used as a receptacle for a cable that is to be electrically connected to the electrical component; and
   a housing that houses the circuit substrate,
   wherein the base is molded from an insulating material into a unitary body that has a shape including:
      a bottomed tube that has an opening into which a plug of the cable is fitted;
      a drainage hole that is formed in a portion of a side plate of the bottomed tube so as to extend through a bottom plate; and
      a wall that stands upright so as to surround a perimeter of the drainage hole on an outer surface of the bottom plate,
   a locking rod that covers a bottom plate side of the drainage hole is provided standing upright on an inner side of the housing, and
   the locking rod abuts against an inner side of the wall on the outer surface of the bottom plate.

2. An electric connection box comprising:
   a circuit substrate on which an electrical component is mounted and to which a receptacle for a cable that is electrically connected to the electrical component is to be attached; and
   a housing that houses the circuit substrate,
   wherein a base of the receptacle is molded from an insulating material into a unitary body that has a shape including:
      a bottomed tube that has an opening into which a plug of the cable is fitted;
      a drainage hole that is formed in a portion of a side plate of the bottomed tube so as to extend through a bottom plate; and
      a wall that stands upright so as to surround a perimeter of the drainage hole on an outer surface of the bottom plate,
   the wall is attached to the circuit substrate so as to extend in a direction opposite to the circuit substrate, and
   a locking rod that abuts against an inner side of the wall and covers a bottom plate side of the drainage hole is provided standing upright on an inner side of the housing.

3. The electric connection box according to claim 2,
   wherein the base of the receptacle is attached to a peripheral edge of the circuit substrate, with the opening facing outward, such that the bottom plate is substantially perpendicular to the circuit substrate, and
   the wall surrounds a perimeter of a bottom plate side-opening of the drainage hole on the outer surface of the bottom plate, except for a portion that is located distally from the circuit substrate.

4. The electric connection box according to claim 2,
   wherein the bottomed tube is composed of a plurality of flat rectangular tubes that are arranged side by side with a predetermined gap therebetween,
   the receptacle is attached such that a side-by-side arrangement direction in which the rectangular tubes are arranged side by side extends along a lateral side of the circuit substrate, and
   the drainage hole is formed in a portion of a side plate that opposes the gap, the side plate being included in one of the rectangular tubes that are arranged side by side, so as to extend through the bottom plate.

5. The electric connection box according to claim 2,
   wherein the locking rod includes:
      a cap plate that covers a bottom plate side-opening of the drainage hole along the bottom plate; and
      a rib plate that is provided at a substantially right angle on a side of the cap plate that is opposite to the drainage hole side, the rib plate being configured to abut against the inner side of the wall.

6. The electric connection box according to claim 2,
   wherein the housing includes a cover plate that covers the electrical component so as to oppose the circuit substrate, and
   the locking rod is provided standing upright at substantially the center of each lateral side of the cover plate so as to form a U-shaped cross section facing inward.

7. An electric connection box comprising:
   a rectangular circuit substrate on which an electrical component is mounted and to which a receptacle for a cable that is electrically connected to the electrical component is attached; and
   a housing that houses the circuit substrate between a housing box and a cover plate,
   wherein a base of the receptacle is molded from an insulating material into a unitary body that includes:
      a plurality of flat rectangular tubes that are arranged side by side in a longitudinal direction with a predetermined gap therebetween on a rectangular bottom plate;
      a drainage hole that is formed in a portion of a side plate that opposes the gap, the side plate being included in one of the rectangular tubes that are arranged side by side, so as to extend through the bottom plate; and
      a thick bottom that is formed on an outer surface of the bottom plate, and includes, on one long side of the bottom plate, a recess that surrounds a perimeter of a bottom plate side-opening of the drainage hole in a U shape,
   the receptacle is attached to a lateral side of the circuit substrate such that the bottom plate is substantially perpendicular to the circuit substrate, openings of the rectangular tubes face outward so that a side-by-side arrangement direction in which the rectangular tubes are arranged side by side extends along the circuit substrate, and the recess is located distally from the circuit substrate, and
   a locking rod that abuts against a surface of the U shape of the recess and covers a bottom plate side of the drainage hole is provided standing upright on an inner side of the housing box or the cover plate of the housing.

* * * * *